United States Patent [19]
Mandai et al.

[11] Patent Number: 5,936,593
[45] Date of Patent: *Aug. 10, 1999

[54] ANTENNA APPARATUS HAVING A SPIRAL CONDUCTOR AND A COATING LAYER

[75] Inventors: Harufumi Mandai, Takatsuki; Kenji Asakura, Shiga; Teruhisa Tsuru, Kameoka; Seiji Kanba, Otsu, all of Japan

[73] Assignee: Murata Manufacturing Co., Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/708,401

[22] Filed: Sep. 4, 1996

[30] Foreign Application Priority Data

Sep. 5, 1995 [JP] Japan .................................. 7-228127

[51] Int. Cl.⁶ .................................................... H01Q 1/36
[52] U.S. Cl. .................................. 343/895; 343/700 MS; 343/872
[58] Field of Search .......................... 343/700 MS, 702, 343/872, 895, 906

[56] References Cited

U.S. PATENT DOCUMENTS

| | | | |
|---|---|---|---|
| 4,598,276 | 7/1986 | Tait | 343/895 |
| 4,679,051 | 7/1987 | Yabu et al. | 343/700 |
| 4,728,962 | 3/1988 | Kitsuda et al. | 343/700 |
| 5,014,071 | 5/1991 | King | 343/788 |
| 5,047,787 | 9/1991 | Hogberg | 343/872 |
| 5,294,938 | 3/1994 | Matsuo et al. | 343/872 |
| 5,402,136 | 3/1995 | Goto et al. | 343/700 |
| 5,412,392 | 5/1995 | Tsunekawa | 343/895 |
| 5,627,551 | 5/1997 | Tsuru et al. | 343/702 |

FOREIGN PATENT DOCUMENTS

| | | |
|---|---|---|
| 621653 | 10/1994 | European Pat. Off. . |
| 687030 | 12/1995 | European Pat. Off. . |
| 2297650 | 8/1996 | United Kingdom . |

*Primary Examiner*—Don Wong
*Assistant Examiner*—Tho Phan
*Attorney, Agent, or Firm*—Ostrolenk, Faber, Gerb & Soffen, LLP

[57] ABSTRACT

An antenna apparatus which exhibits excellent mechanical strength and which is protected from heat and moisture, and also which is mountable on a printed wiring board with the provision of a clearance between the apparatus and the board, free from deformation caused by a warp of the board. The antenna apparatus has a rectangular-prism shaped substrate. A feeding terminal and a fixing terminal are disposed at the respective end surfaces in the longitudinal direction of the substrate. Metal strips serving as support terminals are soldered at the respective first ends to the feeding terminal and the fixing terminal, respectively. A coating material formed of a non-metallic material, such as glass, resin or the like, is applied to the surface of the substrate by way of coating, dipping or other method. A coating layer is thus formed on the substrate in a state in which the respective second ends of the metal strips project from the substrate.

36 Claims, 7 Drawing Sheets

ANTENNA APPARATUS HAVING A SPIRAL CONDUCTOR AND A COATING LAYER

BACKGROUND OF THE INVENTION

1. Field of the Invention

The present invention relates generally to an antenna apparatus. More particularly, the invention relates to an antenna apparatus for use in mobile communications and local area networks (LAN).

2. Description of the Related Art

The construction of a known antenna apparatus will now be described with reference to FIG. 15. Referring to FIG. 15, an antenna apparatus generally designated by 91 has a substrate 92. The substrate 92, which is rectangular-prism shaped, is formed by stacking a plurality of ceramic sheets through, for example, a conductor (not shown), and is provided with a feeding terminal 93 and a fixing terminal 94 at a pair of oppositely-facing lateral surfaces, respectively. The feeding terminal 93 is disposed on the surface of the substrate 92 and is connected to the conductor, while the fixing terminal 94 provided for soldering is not electrically connected. The antenna apparatus 91 constructed as described above is placed on a printed wiring board 95, and the feeding terminal 93 and the fixing terminal 94 are soldered and fixed on the board 95.

However, the antenna apparatus 91 may be chipped or dropped and broken while being handled, and the characteristics of the antenna apparatus 91 may deteriorate due to the oxidation of electrodes or deformation of the members when the apparatus 91 is used under high temperatures and high humidity. Also, the antenna apparatus 91 is surface-mounted on the printed wiring board 95 and completely contacts on an overall surface with the board 95. Accordingly, the apparatus 91 may be deformed if there is a warp in the board 95. Further, the antenna apparatus 91 surface-mounted on the wiring board 95 is positioned in close proximity to the wiring on the wiring board 95. In particular, if the portion of the substrate 92 exhibiting intense directivity is mounted in proximity to the board 95, the directivity of the antenna apparatus 91 is influenced by a ground electrode, which may hamper the desired non-directivity of the apparatus 91. Additionally, if the apparatus 91 is located in proximity to the ground electrode, the capacitance (C) of the antenna line is increased and the inductance (L) is decreased, thus causing the antenna to deviate from a specific impedance (L/C). As a consequence, a desired return loss cannot be obtained and the bandwidth is decreased.

SUMMARY OF THE INVENTION

Accordingly, it is an object of the present invention to provide an antenna apparatus which exhibits excellent mechanical strength and which can be protected from heat and moisture, and which is mountable with the provision of a clearance between the apparatus and a printed wiring board, free from deformation caused by a warp of the board and being less influenced by ground electrodes.

In order to achieve the above and other objects, the present invention provides an antenna apparatus comprising: a substrate; a conductor disposed within the substrate or on the surface of the substrate; a support terminal for connecting the conductor to an external circuit and also for supporting the substrate; and a coating layer formed by applying a coating material to the surface of the substrate.

The support terminal may comprise a metal strip or a connector. The coating layer may be provided with a through hole for allowing a fixing device or devices to pass through the coating layer.

Consequently, according to the antenna apparatus of the present invention, the coating layer is provided to improve the mechanical strength of the substrate and also to protect the apparatus from heat and moisture. Also, the apparatus is mountable on a printed wiring board through a support terminal with the provision of a clearance between the apparatus and the board, thereby obviating the danger of deforming the apparatus due to a warp of the board. Further, since the apparatus is mounted on the wiring board across a clearance, it is not placed in close proximity to the wiring on the board, in particular, a ground electrode.

Further, a fixing device or devices, such as bolts and nuts, or screws, may be used to tighten and securely fix the substrate to the wiring board. The provision of the fixing device makes it possible to mount the apparatus on members other than the printed wiring board.

DETAILED DESCRIPTION OF THE DRAWINGS

The invention will now be described in greater detail in the following detailed description, with reference to the drawings, in which.

DETAILED DESCRIPTION OF EMBODIMENTS OF THE INVENTION

Figure 2:
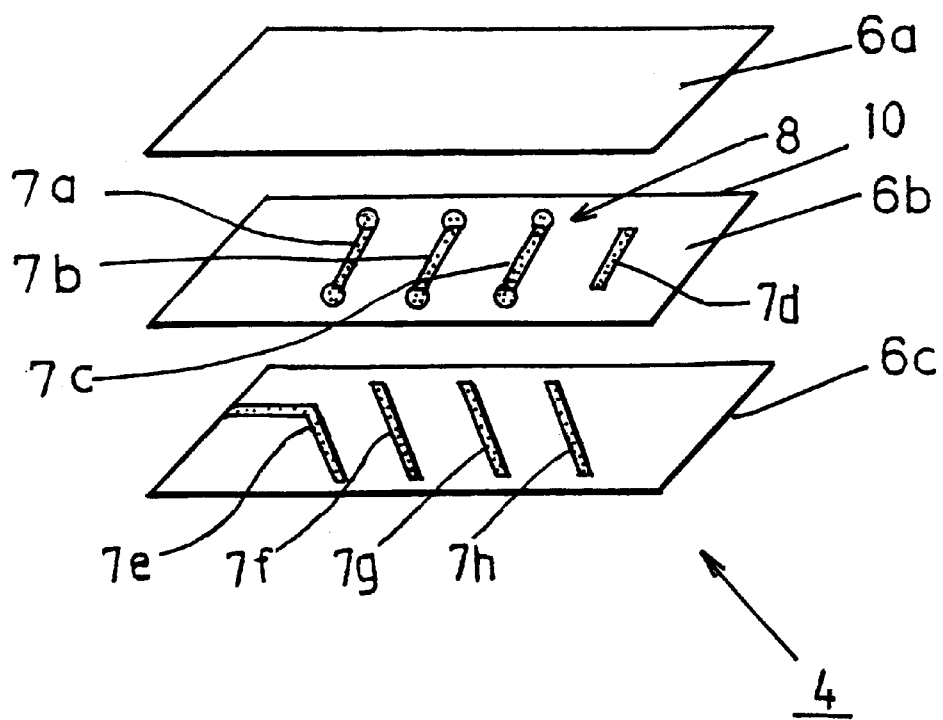
FIG. 2 is an exploded perspective view of the substrate for use in the antenna apparatus shown in FIG. 1.
Figure 3:
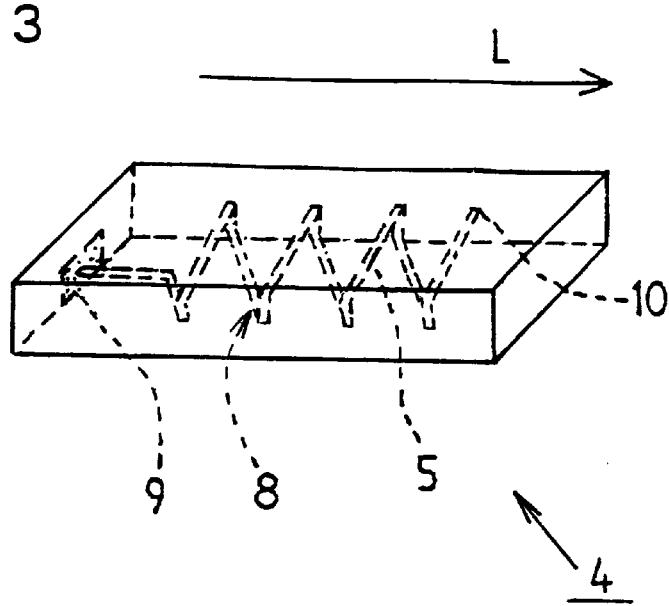
FIG. 3 is a perspective view of the substrate for use in the antenna apparatus shown in FIG. 1.

The construction of an antenna apparatus according to a first embodiment of the present invention will now be described with reference to FIGS. 1 through 3.

Figure 1:
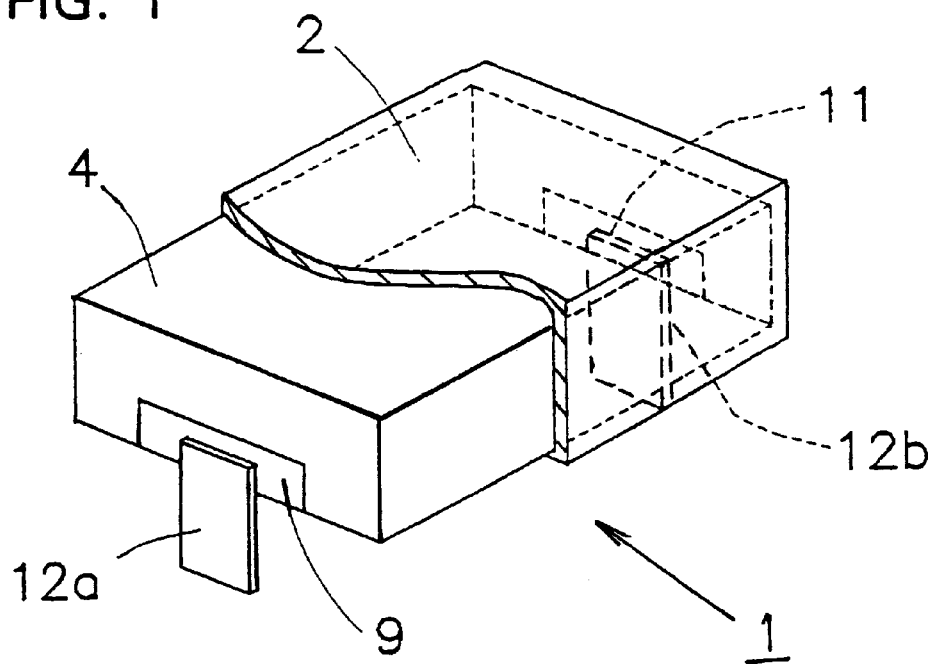
FIG. 1 is a partially perspective view of an antenna apparatus according to a first embodiment of the present invention.

Referring to FIG. 1, an antenna apparatus generally indicated by 1 includes a rectangular-prism-shaped substrate 4. The substrate 4 is provided with a feeding terminal 9 and a fixing terminal 11 at opposing end surfaces, respectively, in the longitudinal direction. Soldered to the feeding terminal 9 and the fixing terminal 11 are the respective first ends of metal strips 12a and 12b serving as support terminals. The metal strips 12a and 12b extend along the thickness of the substrate 4, and outwardly project at second ends from one main surface of the substrate 4. The metal strip 12a is used to connect the feeding terminal 9 to an external circuit and also to support the substrate 4 while the antenna apparatus 1 is mounted. On the other hand, the metal strip 12b, together with the strip 12a, supports the substrate 4 and is not connected to an external circuit. A coating material formed of a non-metallic material, such as plastic, glass, resin, or the like, is applied to the surface of the substrate 4 by means such as coating or dipping, thereby forming a coating layer 2 in the state in which the second ends of the metal strips 12a and 12b project from the substrate 4.

The substrate 4 may be formed by stacking rectangular dielectric sheets 6a through 6c. The dielectric sheets 6a through 6c are formed of: a ceramic essentially comprising, for example, barium oxide, aluminum oxide and silica; resin, such as a teflon (polytetrafluoroethylene) resin or the like; or a mixture of a ceramic and resin. Disposed on the surfaces of the dielectric sheets 6b and 6c by means of printing, vapor deposition, cladding or plating, e.g., are generally-linear conductive patterns 7a through 7h formed of, e.g., copper or a copper alloy. Conductors also fill via holes formed along the thickness of the sheet 6b so as to form via-hole wiring 8 on the sheet 6b. Then, the dielectric sheets 6a through 6c are stacked on each other, and the conductive patterns 7a through 7h are connected to each other through the via-hole wiring 8, thereby forming a spiral conductor 5 having a rectangular shape in cross section wound along the longitudinal direction of the substrate 4 (in the direction indicated by the arrow L of FIG. 3).

One end of the conductor 5 (one end of the conductive pattern 7e) is pulled out to the lateral surface of the substrate 4 and is connected to the feeding terminal 9. The feeding terminal 9 is formed on one lateral surface of the substrate 4 and is used for applying a voltage to the conductor 5. The other end of the conductor 5 (one end of the conductive pattern 7d) is free to form a free end 10 within the substrate 4. Since the substrate 4 is thus formed by providing the spiral conductor 5, it is possible to downsize the substrate 4 to the dimensions of, for example, a width of 5 mm, a length of 8 mm and a height of 2.5 mm. Further, a fixing terminal 11 is formed on the other lateral surface of the substrate 4 oppositely facing the surface on which the feeding terminal 9 is disposed. The fixing terminal 11 is provided for soldering and is not connected to the circuit within the substrate 4.

Figure 4:
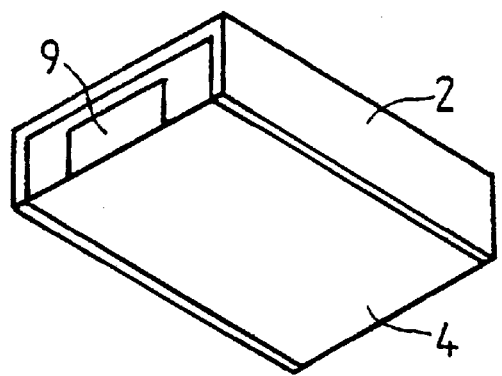
FIG. 4 is a perspective view of the substrate and the coating layer for use in another antenna apparatus according to the first embodiment of the present invention.
Figure 5:
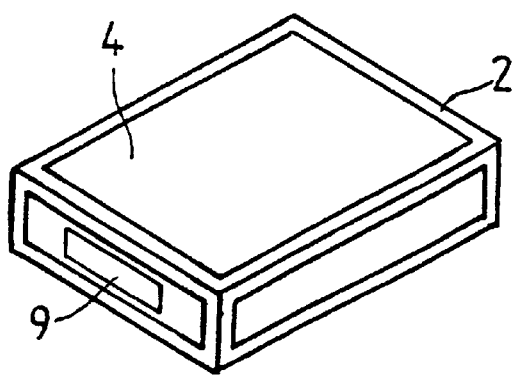
FIG. 5 is a perspective view of the substrate and the coating layer for use in still another antenna apparatus according to the first embodiment of the present invention.

The area of the substrate 4 to be covered with the coating layer 2 is not particularly restricted as long as the mechanical strength of the substrate 4 can be enhanced. For example, the coating layer 2 may be formed, as shown in FIG. 4, only on one main surface and lateral surfaces of the substrate 4, or may be formed only on and around the peripheral edges of the respective surfaces of the substrate 4, as shown in FIG. 5.

Figure 6:
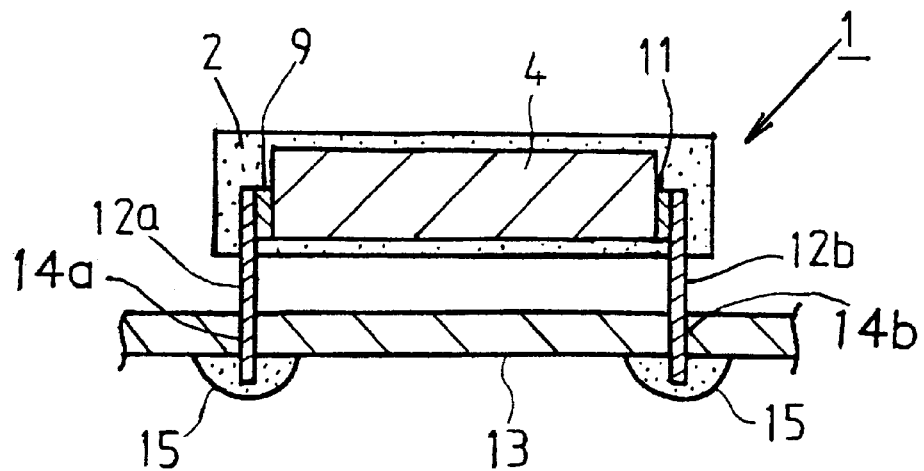
FIG. 6 is a sectional view of the antenna apparatus shown in FIG. 1 mounted on a printed wiring board.

For mounting the antenna apparatus 1 on a printed wiring board 13, as illustrated in FIG. 6, the metal strips 12a and 12b are inserted into through holes 14a and 14b, respectively, formed in the wiring board 13 and are fixed by means of solder 15. In this manner, the antenna apparatus 1 is fixed on the printed wiring board 13 while providing a clearance between the substrate 4 and the board 13.

Figure 7:
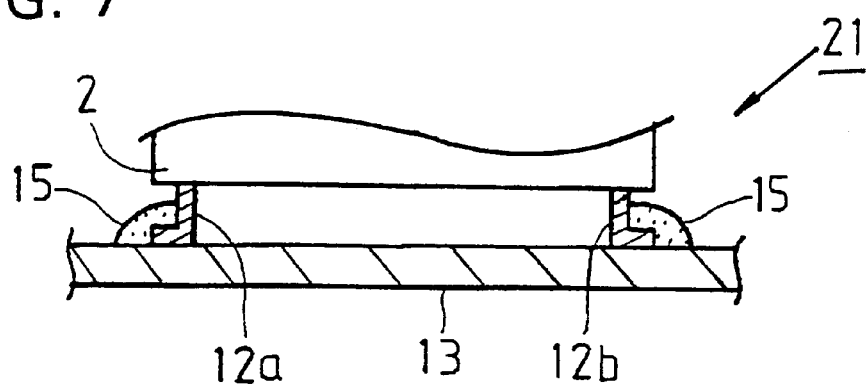
FIG. 7 is a partially side sectional view of another antenna apparatus of the first embodiment mounted on a printed wiring board.

Alternatively, as indicated by an antenna apparatus 21 shown in FIG. 7, the second ends of the metal strips 12a and 12b may be bent, and the bent portions may be fixed on the board 13 by means of the solder 15. The metal strips 12a and 12b may be bent in any desired direction.

Figure 8:
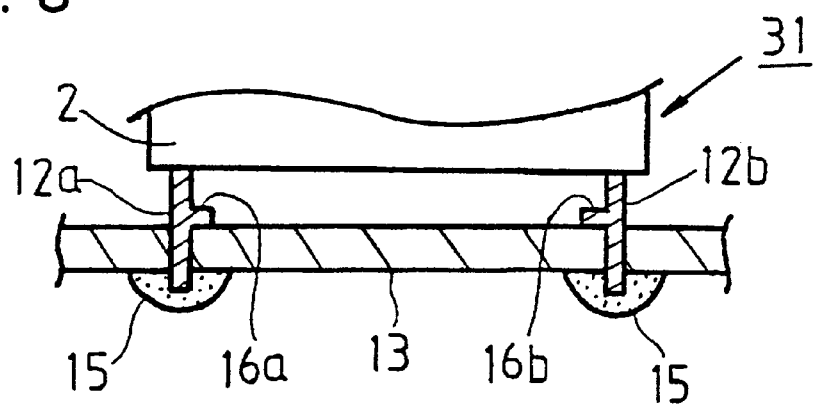
FIG. 8 is a partially side sectional view of still another antenna apparatus of the first embodiment mounted on a printed wiring board.

As indicated by an antenna apparatus 31 illustrated in FIG. 8, the projections 16a and 16b may also be provided for the metal strips 12a and 12b, respectively. The strips 12a and 12b may be first inserted into the through holes 14a and 14b, respectively, of the board 13 and be retained on the board 13 by the projections 16a and 16b. Then, the strips 12a and 12b may be fixed on the board 13 by means of the solder 15. The directions for forming the projections 16a and 16b are not particularly restricted.

Figure 9:
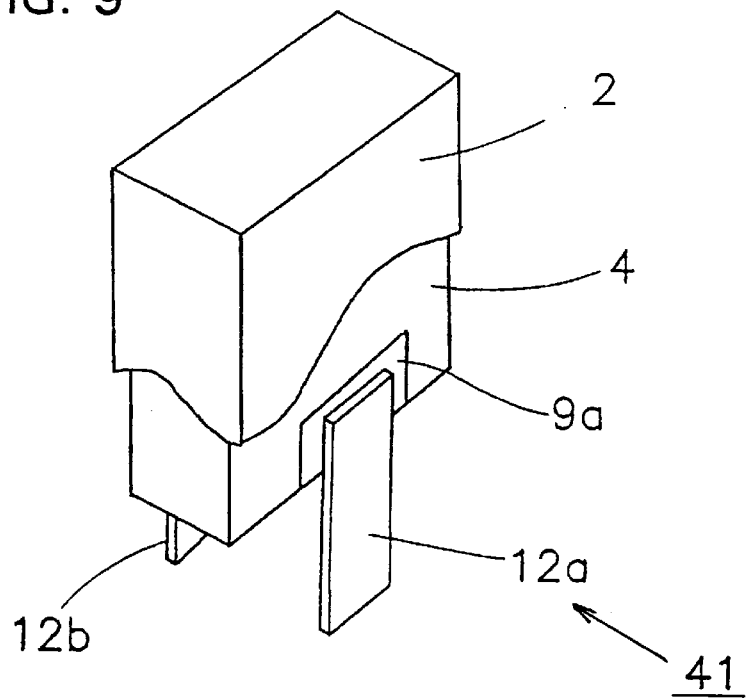
FIG. 9 is a perspective view of a further antenna apparatus according to the first embodiment of the present invention.

Further, as indicated by an antenna apparatus 41 shown in FIG. 9, the metal strips 12a and 12b may be soldered to the main surfaces of the substrate 4. In this case, an extending portion 9a of the feeding terminal 9 is provided for the main surface of the substrate 4, and the metal strip 12a is soldered to the extending portion 9a. The antenna apparatus 41 constructed as described above is mounted on the printed wiring board 13 in such a manner that the longitudinal direction of the substrate 4 can be perpendicular to the board 13.

The antenna apparatus 1, 21, 31 and 41 constructed as described above have improved mechanical strength, since the substrate 4 is covered with the coating layer 2, and even when the apparatus 1, 21, 31 and 41 are used under high temperatures or high humidity, they can be protected from heat and moisture by the coating layer 2, thereby obtaining desired characteristics.

The substrate 4 is mountable on the printed wiring board 13 through the metal strips 12a and 12b with the provision of a clearance between the substrate 4 and the board 13, thereby eliminating the possibility of deforming the substrate 4 caused by a warp of the board 13. Moreover, since the substrate 4 is mounted on the board 13 across a clearance, it is not placed in close proximity to the wiring on the board 13, in particular, a ground electrode, thereby achieving desired characteristics. Additionally, ease of positioning of the substrate 4 on the wiring board 13 is implemented if the metal strips 12a and 12b are inserted into the through holes of the board 13 in order to fix the substrate 4 on the board 13.

A second embodiment of the present invention will now be explained with reference to FIG. 10. The same and corresponding elements as those described in the first embodiment are designated by like reference numerals, and an explanation thereof will thus be omitted.

Figure 10:
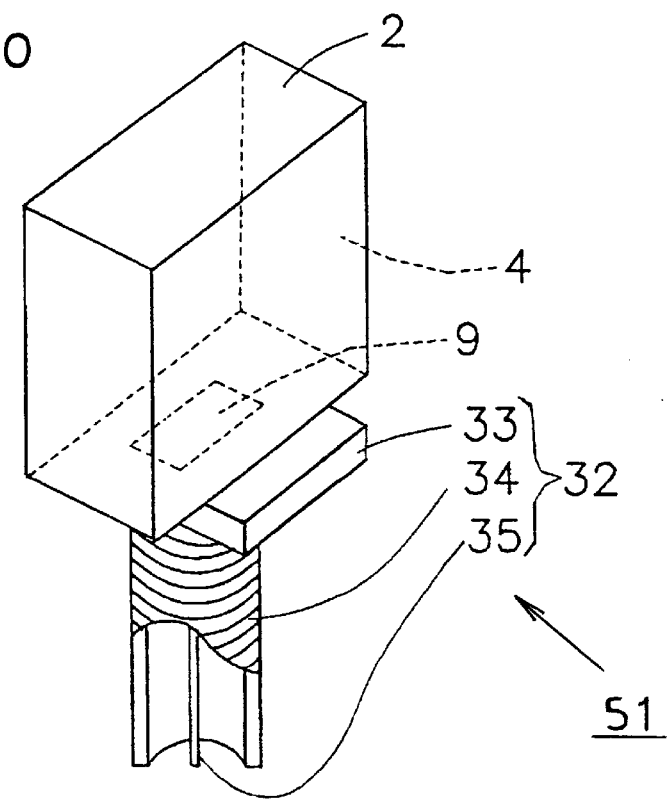
FIG. 10 is a partially perspective view of an antenna apparatus according to a second embodiment of the present invention.

Referring to FIG. 10, an antenna apparatus generally indicated by 51 is covered with the coating layer 2 in a state in which a connector 32 attached as a support terminal to the feeding terminal 9 of the substrate 4 projects from the surface of the substrate 4. The connector 32 is formed of a tabular portion 33, a male screw 34, and a conducting wire 35 passing through the inside of the conductor 32. The conducting wire 35 is connected to the feeding terminal 9 of the substrate 4. The antenna apparatus 51 is firmly mounted on the print wiring board by fitting the male screw 34 into a threaded hole formed in the wiring board or a member other than the board.

Figure 11:
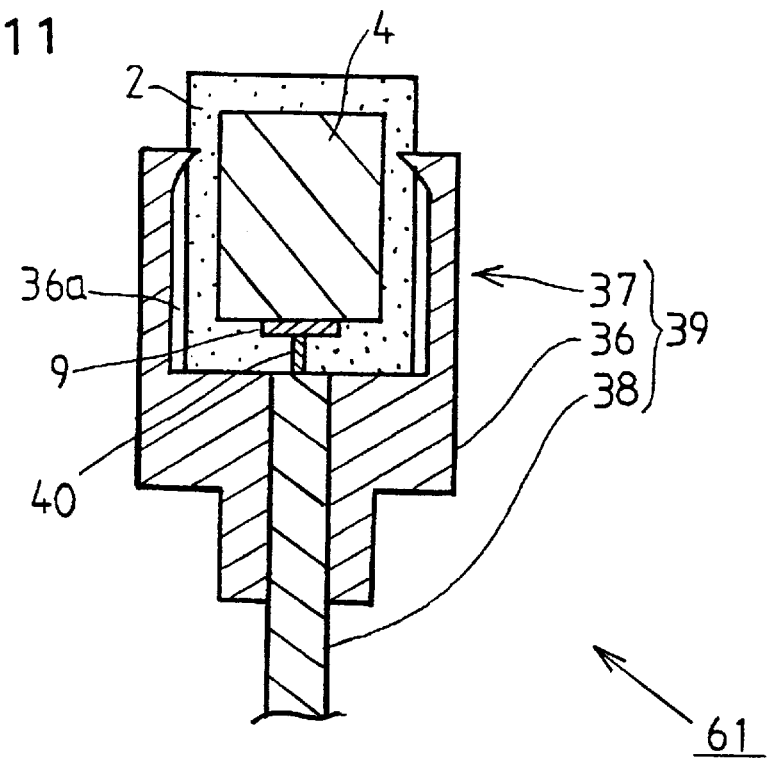
FIG. 11 is a sectional view of another antenna apparatus according to the second embodiment.
Figure 12:
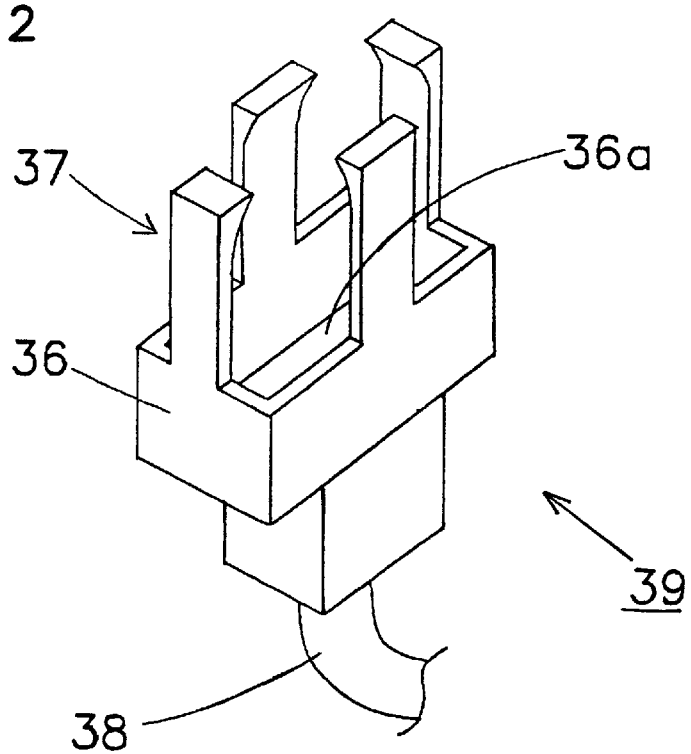
FIG. 12 is a perspective view of a connector for use in the antenna apparatus shown in FIG. 11.

The connector 32 serving as a support terminal described above is not exclusive. For example, as illustrated in FIGS. 11 and 12, a connector 39 including a plurality of legs 37 may be used to form an antenna apparatus 61. The connector 39 has, as shown in FIG. 12, a connector base 36 provided with a recess 36a, a plurality of legs 37 and a conducting wire 38 formed of a coaxial cable or a lead wire passing through the inside of the base 36. The substrate 4 (coating layer 2) of the antenna apparatus 61 is partially fit into the recess 36a and the main surfaces so that the lateral surfaces of the substrate 4 can be clamped by the legs 37. Further, the legs 37 are formed in the shape of a hook at the forward ends so that they can firmly retain the coating layer 2 covering the substrate 4, whereby the substrate 4 can be further securely mounted. A lead wire 40 pulled out of the feeding terminal 9 of the substrate 4 is connected to the conducting wire 38 at the bottom of the recess 36a.

The antenna apparatus 51 and 61 constructed as described above can offer advantages similar to those obtained in the first embodiment. Additionally, the apparatus 51 and 61 are mountable not only on a printed wiring board but also on other members and are then connectable to the board via the conducting wire of the connector.

Figure 13:
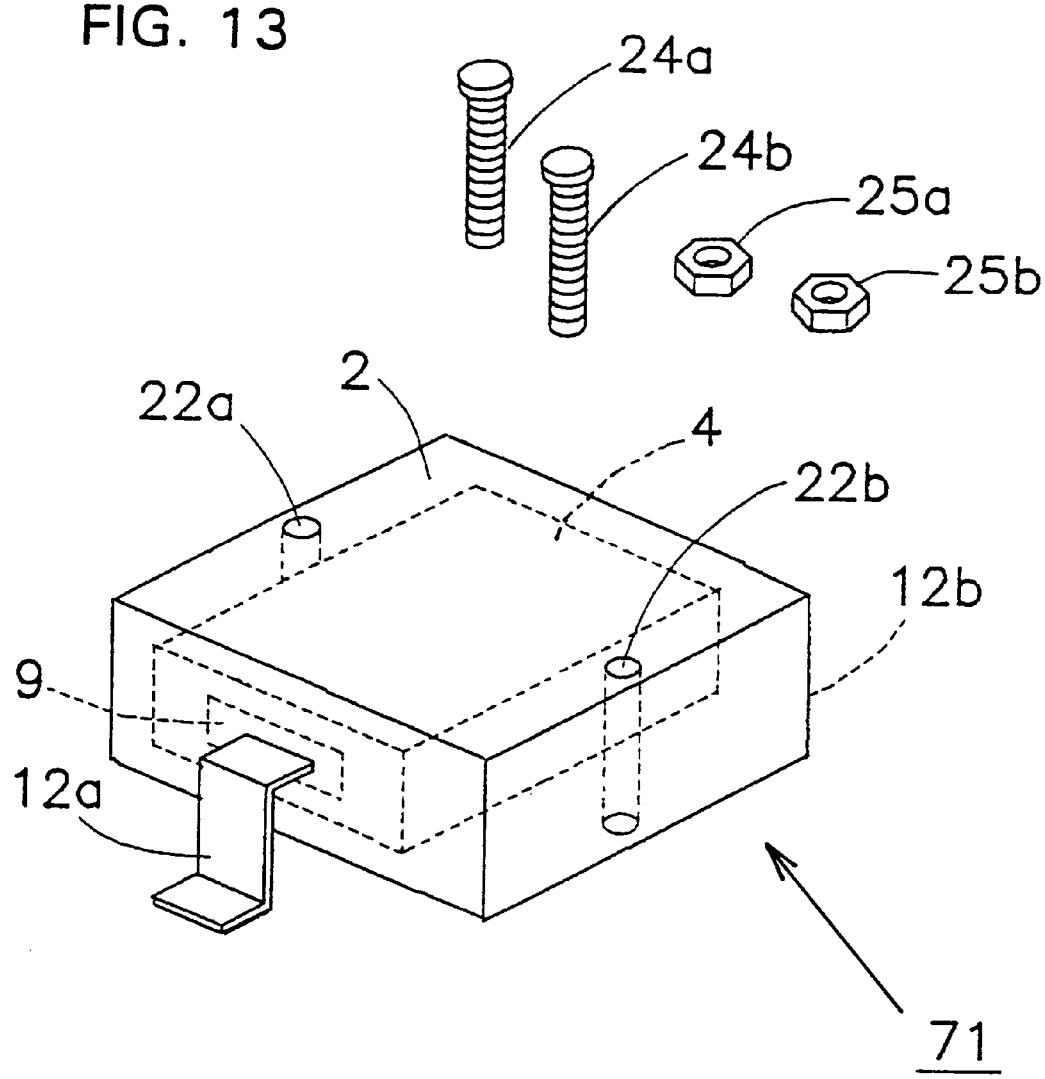
FIG. 13 is a perspective view of an antenna apparatus according to a third embodiment of the present invention.

An explanation will further be given with reference to FIG. 13 of the construction of an antenna apparatus according to a third embodiment of the present invention. In this embodiment, through holes for allowing a fixing device or devices to pass through a coating layer covering the substrate are provided with the layer. The same and corresponding elements as those explained in the first embodiment are designated by like reference numerals, and an explanation thereof will thus be omitted.

Referring to FIG. 13, an antenna apparatus generally designated by 71 is provided with through holes 22a and 22b passing through the coating layer 2 along its thickness. For mounting the antenna apparatus 71 on a printed wiring board, mating holes corresponding to the above-described through holes are formed on the board. The metal strips 12a and 12b are soldered to the feeding terminal 9 and the fixing terminal 11, respectively. Then, fixing devices, for example, bolts 24a and 24b, are inserted into the through holes 22a and 22b of the coating layer 2 and the mating holes provided for the wiring board, and are tightened and fixed by means of nuts 25a and 25b, respectively.

Figure 14:
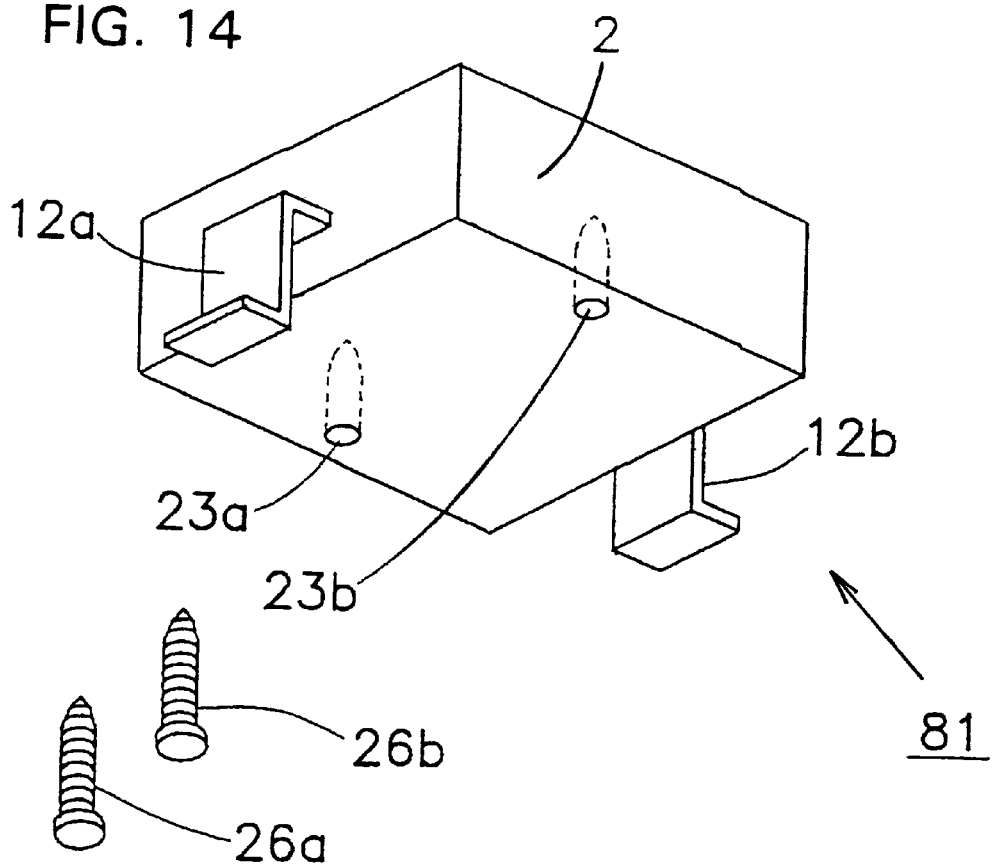
FIG. 14 is a partially perspective view of another antenna apparatus of the third embodiment.
Figure 15:
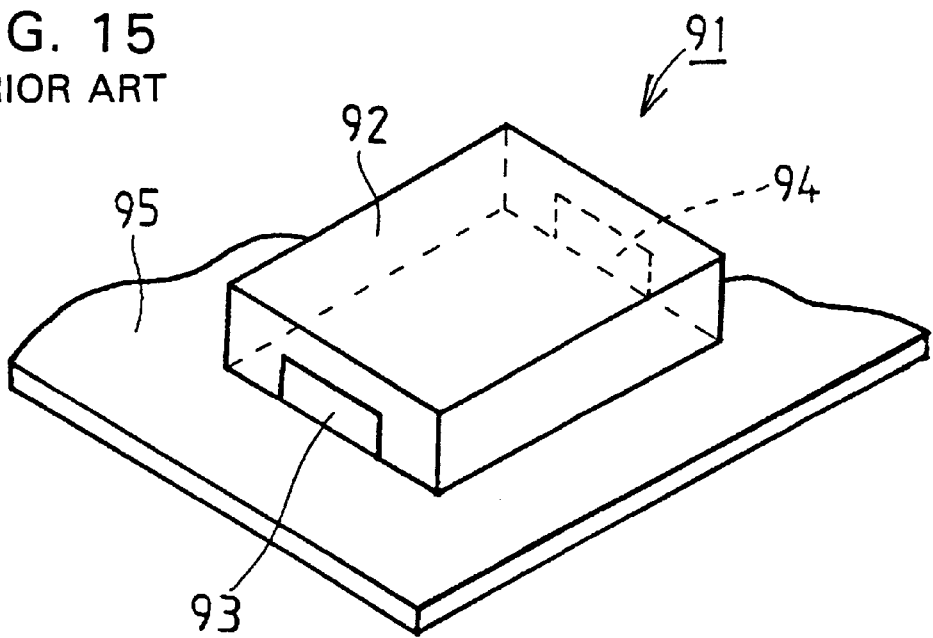
FIG. 15 is a perspective view of a known antenna apparatus mounted on a printed wiring board.

Alternatively, as indicated by an antenna apparatus 81 illustrated in FIG. 14, screw holes 23a and 23b may be formed as through holes in the area from the mounting surface to the substantially intermediate portion of the coating layer 2 along its thickness, and screws 26a and 26b serving as fixing devices may be fitted into the holes 23a and 23b, respectively, and tightened from the reverse surface of a printed wiring board.

The antenna apparatus 71 and 81 constructed as described above exhibit advantages similar to those obtained in the first embodiment. Additionally, the apparatus 71 and 81 can be firmly secured on a printed wiring board by means of fixing devices, such as bolts and nuts, or screws. The use of the fixing devices further makes it possible to mount the apparatus 71 and 81 on a member other than a printed wiring board.

Although the first through third embodiments have been explained in which the substrate is formed in a rectangular-prism shape, it may be formed in other shapes, such as a tabular shape or any other desired shape. Also, although in the foregoing embodiments the conductor wound within the substrate is rectangularly shaped in cross section, it may be circular, generally semi-circular or generally in the shape of a partially-linear track.

Further, although in the foregoing embodiments the conductor is formed within the substrate, the conductive patterns may be wound on the surface of the substrate so as to form a conductor. Additionally, the surface of the dielectric sheets may be spirally grooved, and wire, such as plated wire, enamel wire or the like, may be wound along the groove to form a conductor.

In the first through third embodiments, the substrate is formed by stacking a plurality of dielectric sheets on each other. However, the substrate may be constructed by the use of, for example, a dielectric block. The material for the substrate is not restricted to a dielectric member, and a magnetic member may be used singly or a dielectric member and a magnetic member may be clad to form a substrate block. In the above case, the conductor may be formed on the surface of the substrate.

Moreover, the foregoing embodiments have been explained in which the conductive patterns are wound in the longitudinal direction of the substrate so as to form a conductor. However, the conductive patterns may be wound along the height of the substrate. Although in the first through third embodiments the conductive patterns are three-dimensionally wound, they may be extended along the surface of the substrate or in a plane within the substrate to be formed in a wave-like or a zigzag shape. Also, although the substrate is rectangular-prism shaped in the foregoing embodiments, it may have other shapes, such as spherical, cubic, cylindrical, conical, or pyramid-like shapes.

As will be clearly understood from the foregoing description, the antenna apparatus of the present invention offers the following advantages.

The provision of a coating layer increases the mechanical strength of the substrate, thereby preventing damage to the antenna apparatus when it is dropped or contacts other materials. Even when the apparatus is used in an environment of high temperatures or high humidity, the apparatus can be protected from heat and moisture by the coating layer, thereby avoiding a deterioration in antenna characteristics.

Further, the antenna apparatus is mountable on a printed wiring board via a support terminal with the provision of a clearance between the apparatus and the board, thereby eliminating the possibility of deforming the apparatus caused by a warp of the wiring board. Further, since the apparatus is mounted on the board across a clearance, it is not placed in close proximity to the wiring on the board, in particular, a ground electrode, thereby implementing desired characteristics.

Additionally, a fixing device or devices is used to enable the apparatus to be firmly fixed on the wiring board. The use of the fixing devices also makes it possible to mount the apparatus on members other than a printed wiring board.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. An antenna apparatus comprising:

a substrate;

a conductor disposed at least one of within said substrate and on a surface of said substrate, the substrate being formed by laminating a plurality of layers together, the layers each having a major surface and the substrate having a laminating direction defined by a direction normal to the major surface;

a support terminal for connecting said conductor to an external circuit and also for supporting said substrate;

a coating layer formed by applying a non-metallic coating material to the surface of said substrate; and said conductor being spiral shaped, the spiral being three dimensional and having a spiral axis disposed perpendicular to the laminating direction of said substrate, and further wherein respective ones of the layers have at least one conductive pattern formed thereon, at least one of the layers having through holes formed therein for connecting the at least one conductive pattern on respective ones of the layers together when the layers are laminated together to form the substrate thereby forming said conductor.

2. An antenna apparatus according to claim 1, wherein said support terminal comprises a metal strip.

3. An antenna apparatus according to claim 2, wherein a through hole for allowing a fixing device to pass through said coating layer is provided in said coating layer.

4. An antenna apparatus according to claim 1, wherein said support terminal comprises a connector.

5. An antenna apparatus according to claim 1, wherein a through hole for allowing a fixing device to pass through said coating layer is provided in said coating layer.

6. An antenna apparatus according to claim 5, wherein the fixing device comprises at least one of screws, bolts and nuts.

7. An antenna apparatus according to claim 1, wherein the coating only partially covers the surface of said substrate.

8. An antenna apparatus according to claim 7, wherein the substrate is a rectangular parallelopiped and has top and bottom surfaces, side surfaces and end surfaces, substantially only the top surface and two side surfaces having said coating layer, the end surfaces having said support terminal being substantially uncoated.

9. An antenna apparatus according to claim 7, wherein substantially only corner edges of said substrate have said coating layer.

10. An antenna apparatus according to claim 1, wherein the support terminal comprises a first terminal connected to the conductor for electrical connection to a voltage and a fixing terminal unconnected to the conductor.

11. An antenna apparatus according to claim 1, wherein the support terminal holds the substrate a defined distance above a mounting surface.

12. An antenna apparatus according to claim 11, wherein the support terminal extends through the mounting surface.

13. An antenna apparatus according to claim 11, wherein the support terminal is bent at an angle for surface mounting to the mounting surface.

14. An antenna apparatus according to claim 11, wherein the support terminal includes a ledge for supporting the substrate at said defined distance.

15. An antenna apparatus according to claim 11, wherein said substrate has two broad faces comprising end faces, the end faces having said support terminal thereon, the substrate adapted to be mounted such that the broad end faces are disposed perpendicular to the plane of the mounting surface.

16. An antenna apparatus according to claim 1 wherein said substrate has two broad top and bottom faces, the substrate being mountable on a mounting surface such that the broad top and bottom faces are parallel to the plane of the mounting surface.

17. An antenna apparatus according to claim 1, wherein the support terminal comprises a tabular portion connected to the substrate, a hollow screw portion connected to the tabular portion and a wire in the hollow screw portion connected to the conductor.

18. An antenna apparatus according to claim 1, wherein the support terminal comprises a plurality of legs for gripping said coating on said substrate, the plurality of legs forming a cradle for the coated substrate and the cradle having a hole for a wire coupled to the conductor.

19. An antenna apparatus according to claim 18, wherein the plurality of legs each having an inwardly directed tang thereon for gripping the coating layer on the substrate.

20. An antenna apparatus according to claim 1, wherein the conductor is rectangular in cross-section.

21. An antenna apparatus according to claim 1, wherein the substrate is one of rectangular prism shaped, and cubic shaped.

22. An antenna apparatus according to claim 1, wherein the conductor is disposed on the surface of the substrate.

23. An antenna apparatus according to claim 1, wherein the conductor is disposed on a plane in the interior of the substrate.

24. An antenna apparatus according to claim 1, wherein the conductor is formed in a plane on one of a surface of the substrate and inside the substrate in a zig-zag shape.

25. An antenna apparatus according to claim 1, wherein the substrate is one of a dielectric material, magnetic material and combination of a dielectric and magnetic material.

26. An antenna apparatus according to claim 1, wherein the substrate is a unitary dielectric or magnetic block.

27. An antenna apparatus according to claim 1, wherein the coating layer comprises one of glass, plastic and resin.

28. An antenna apparatus according to claim 27, wherein the coating layer is applied by one of dipping and coating.

29. An antenna apparatus according to claim 1, wherein the coating layer is non-metallic.

30. An antenna apparatus according to claim 1, wherein the substrate is a dielectric ceramic comprising substantially at least one of barium oxide, aluminum oxide, silica and resin and mixture of any of the above.

31. An antenna apparatus according to claim 30, wherein the resin comprises a polytetrafluoroethylene resin.

32. An antenna apparatus according to claim 1, wherein the conductor comprises one of copper and a copper alloy.

33. An antenna apparatus according to claim 1, wherein the conductor is formed by one of printing, vapor deposition, cladding and plating.

34. An antenna apparatus according to claim 1, wherein the conductor has a free unconnected terminal.

35. An antenna apparatus according to claim 1, wherein the support terminal extends beyond the coating layer.

36. An antenna apparatus comprising:

a substrate, a conductor disposed within said substrate, the substrate being formed by laminating a plurality of layers together, the layers each having a major surface and the substrate having a laminating direction defined by a direction normal to the major surface;

respective ones of the layers having at least one conductive pattern formed thereon, at least one of the layers having through holes formed therein for connecting the at least one conductive pattern on respective ones of the layers together when the layers are laminated together to form the substrate thereby forming said conductor;

a support terminal for connecting said conductor to an external circuit and also for supporting said substrate;

a coating layer formed by applying a non-metallic coating material to the surface of said substrate; and said conductor being spiral shaped, the spiral being three dimensional and having a spiral axis disposed perpendicular to the laminating direction of said substrate.

* * * * *